(12) United States Patent
Lanois

(10) Patent No.: US 6,590,240 B1
(45) Date of Patent: Jul. 8, 2003

(54) METHOD OF MANUFACTURING UNIPOLAR COMPONENTS

(75) Inventor: Frédéric Lanois, Tours (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/628,053

(22) Filed: Jul. 28, 2000

(30) Foreign Application Priority Data

Jul. 28, 1999 (FR) ............................................. 99 09985

(51) Int. Cl.7 ........................ H01L 29/80; H01L 31/112
(52) U.S. Cl. ........................ 257/256; 257/262; 257/263; 257/267; 257/280
(58) Field of Search ................. 257/256, 262, 257/263, 267, 280

(56) References Cited

U.S. PATENT DOCUMENTS

| | | | |
|---|---|---|---|
| RE35,405 E | * 12/1996 | Murakami et al. | ............. 437/41 |
| 5,701,026 A | 12/1997 | Fujishima et al. | .......... 257/510 |
| 5,973,360 A | 10/1999 | Tihanyi | ....................... 257/330 |
| 6,078,090 A | * 6/2000 | Williams et al. | ............. 257/334 |
| 6,184,545 B1 | * 2/2001 | Werner et al. | ............... 257/109 |
| 6,191,447 B1 | * 2/2001 | Baliga | ......................... 257/330 |

FOREIGN PATENT DOCUMENTS

| | | | |
|---|---|---|---|
| DE | 196 04 043 A | 8/1997 | ............ H01L/29/78 |
| DE | 197 40 195 A | 3/1999 | ......... H01L/29/872 |
| DE | 197 48 523 A | 5/1999 | ............ H01L/29/78 |
| JP | 11-087684 A | * 3/1999 | ......... H01L/27/146 |
| JP | 2000-049362 A | * 2/2000 | ......... H01L/29/872 |

OTHER PUBLICATIONS

European Search Report from application No. 00 41 0086, filed Jul. 28, 1999.
*Theory of a Novel Voltage–Sustaining Layer for Power Devices*, X.B. Chen et al., Microelectronics Journal, GB, Mackintosh Pub. Ltd. Luton, vol. 29, No. 12, Dec. 1, 1998, p. 1005–1011.

* cited by examiner

*Primary Examiner*—Eddie Lee
*Assistant Examiner*—Matthew E. Warren
(74) *Attorney, Agent, or Firm*—Wolf, Greenfield & Sacks, P.C.; James H. Morris; William R. McClellan

(57) ABSTRACT

A method of manufacturing a unipolar component of vertical type in a substrate of a first conductivity type, including the steps of: forming trenches in a silicon layer of the first conductivity type; coating the lateral walls of the trenches with a silicon oxide layer; filling the trenches with polysilicon of the second conductivity type; and annealing to adjust the doping level of the polysilicon, the excess dopants being absorbed by the silicon oxide layer.

8 Claims, 2 Drawing Sheets

METHOD OF MANUFACTURING UNIPOLAR COMPONENTS

BACKGROUND OF THE INVENTION

1. Field of the Invention

The present invention relates to the manufacturing of unipolar components in vertical monolithic form. More particularly, the present invention relates to components such as Schottky diodes or MOS transistors made in vertical form in silicon substrates.

2. Discussion of the Related Art

In the manufacturing of unipolar components, opposite constraints have to be reconciled. Unipolar components must have as small a resistance (Ron) as possible when on, while having as high a breakdown voltage as possible when reverse biased. Minimizing the on-state resistance of a unipolar component requires minimizing the thickness of the less doped layer and maximizing the doping of this layer. However, to obtain a high breakdown voltage requires maximizing the thickness of the less doped layer and minimizing the doping of this layer. It is thus necessary to find a compromise between a high breakdown voltage and a reasonable on-state resistance.

SUMMARY OF THE INVENTION

An object of the present invention is to provide a novel method of manufacturing unipolar components of vertical type.

Another object of the present invention is to provide such a manufacturing method for a novel structure of unipolar components of vertical type that has a higher breakdown voltage.

To achieve these and other objects, the present invention provides a method of manufacturing a unipolar component of vertical type in a substrate of a first conductivity type, including the steps of:

forming trenches in a silicon layer of the first conductivity type;

coating the lateral walls of the trenches with a silicon oxide layer;

filling the trenches with polysilicon of the second conductivity type; and annealing to adjust the doping level of the polysilicon, the excess dopants being absorbed by the silicon oxide layer.

The present invention also provides a unipolar component of vertical type including, in a layer of a first conductivity type, trenches filled with polysilicon of the second conductivity type, the lateral walls of the trenches being coated with a silicon oxide layer and the polysilicon doping being adjusted to be substantially equal to that of the layer of first conductivity type.

According to an embodiment of the present invention, the component is a Schottky diode and the trenches are formed in a layer intended for forming the diode cathode.

According to an embodiment of the present invention, the component is a MOS transistor including a plurality of source cells and the trenches are formed at the center of each of the cells.

According to an embodiment of the present invention, the component is a MOS transistor including a plurality of source cells and the trenches are formed between the cells.

According to an embodiment of the present invention, the component is a MOS transistor including a plurality of source cells and the trenches are formed at the center of the cells and between the cells.

According to an embodiment of the present invention, the surfaces of the trenches between cells are in contact with metallizations electrically connected to source metallizations of the cells.

The foregoing objects, features and advantages of the present invention, will be discussed in detail in the following non-limiting description of specific embodiments in connection with the accompanying drawings.

DETAILED DESCRIPTION

For clarity, the same elements have been designated by the same references in the different drawings. Further, as usual in the representation of integrated circuits, the drawings are not to scale.

An embodiment of the present invention is described hereafter as an example in the case of the manufacturing of a vertical monolithic Schottky diode.

Figure 1:
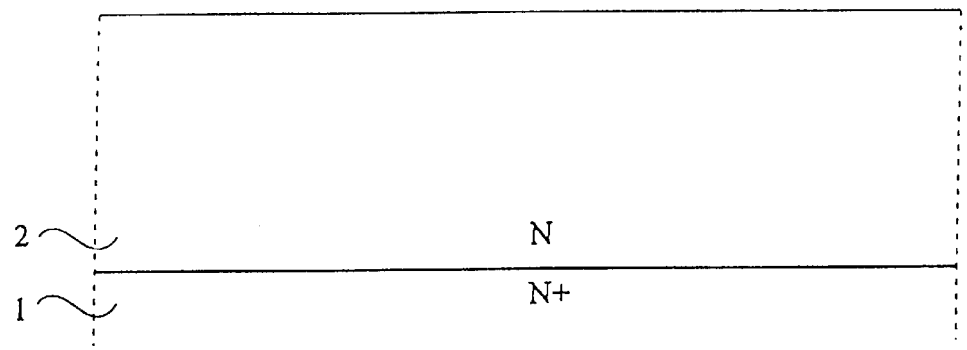
FIGS. 1 to 4 are partial simplified cross-section views of a Schottky diode at different steps of an example of implementation of a manufacturing method according to the present invention.

FIG. 1 shows the state of a heavily-doped silicon substrate 1 of a first conductivity type, for example, type N. Substrate 1 is intended for being used as a cathode contacting area of the diode.

An N-type doped layer 2, more lightly doped than substrate 1, covers substrate 1. Layer 2 results, for example, from an epitaxial growth, over a thickness included between approximately 1 and 100 $\mu$m. Cathode layer 2 of the Schottky diode is intended for ensuring the breakdown voltage of this Schottky diode.

Figure 2:
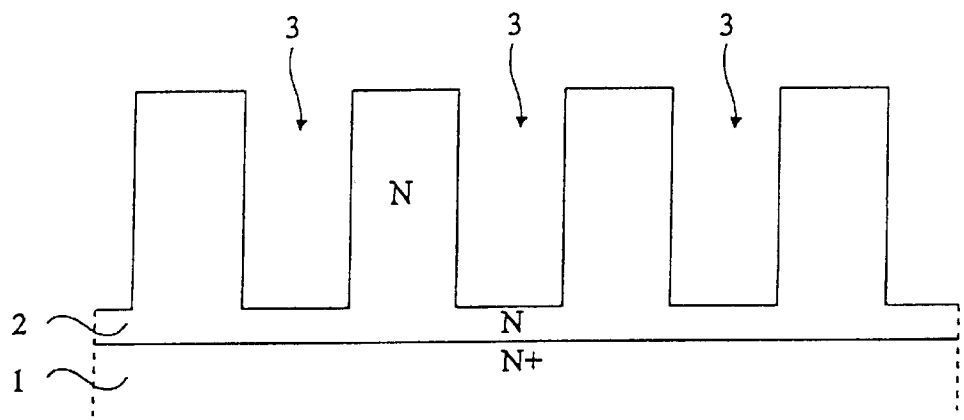

At the following steps, the result of which is illustrated in FIG. 2, trenches 3 are formed according to the present invention in layer 2. Trenches 3 result from an etching of layer 2 by means of a single mask. Trenches 3 having a width of, for example, 2 $\mu$m and distant by approximately 2 $\mu$m, are arranged in a way that will be explained hereafter. Their depth is smaller than the thickness of epitaxial layer 2.

Figure 3:
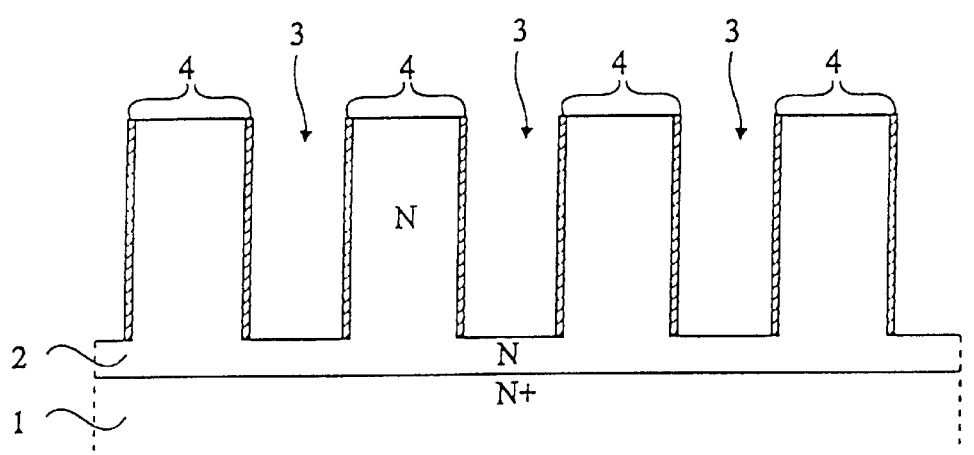

At the next steps, the result of which is illustrated in FIG. 3, the walls of trenches 3 are coated with a thin insulating layer 4. Preferably, layer 4 is a silicon oxide layer having a thickness of approximately 50 nm. The bottoms of trenches 3 are maintained exposed. Insulating layer 4 may result from a silicon oxide deposition, or from the growth of a thermal oxide, followed by an anisotropic etching of the horizontal portions of the silicon oxide layer, at the top of the structure thus formed as well as at the bottom of trenches 3.

The advantages due to the forming of layer 4 on the walls of trenches 3 will be discussed subsequently.

Figure 4:
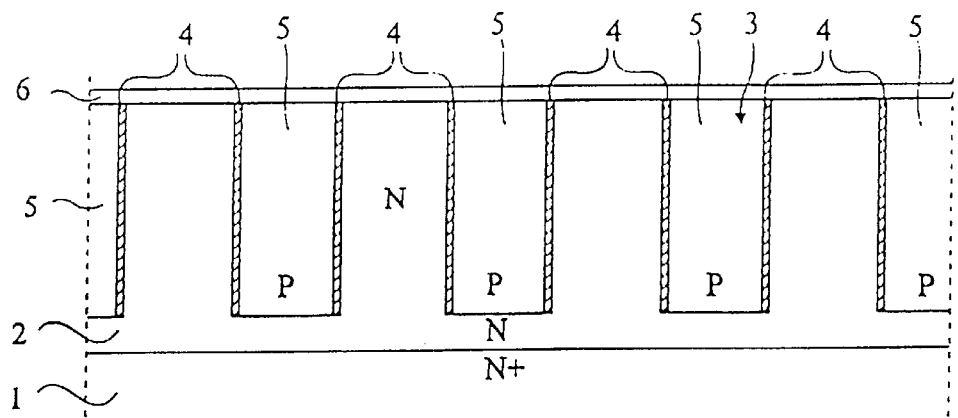

At the next steps, the result of which is illustrated in FIG. 4, trenches 3 (FIG. 3) are filled with a semiconductor material 5. With current techniques, it is simpler to provide that this semiconductor is polysilicon. The filling of trenches 3 is ensured, for example, by chemical vapor deposition (CVD) of polysilicon of a type opposite to that of layer 2 and reetching, for example by chem-mech etching. In the considered case of an N-type epitaxial layer 2, silicon 5 is P-type doped by boron. It should be noted that such a doping may be performed either in situ or by implantation/diffusion. This latter solution can be implemented due to the fact that the diffusion speed of the dopants in polysilicon is much greater than the speed of diffusion into single-crystal silicon. The doping is then performed before reetching the upper polysilicon layer. The method is continued by the deposition of a metal layer 6 adapted to form a Schottky contact with N-type silicon 2.

The present invention enables obtaining in a simple way a Schottky diode with a relatively low on-state resistance for a relatively high breakdown voltage.

This diode operates as follows.

When forward biased, that is, when metallization 6 is positively biased with respect to N+-type layer 1, the current flows from metallization 6 to layer 1 and this forms a normal Schottky diode between layer 6 and N regions 2. The existence of a contact between metallization 6 and the upper surface of material 5 contained in trenches 3 has no influence upon the system operation, since the forward PN junction between material 5 at the bottom of trenches 3 and layer 2 can only be made conductive if the corresponding voltage drop exceeds 0.6 to 0.7 volts. In practice, the potential at the level of this PN junction is equal to the value of the forward Schottky voltage drop (on the order of 0.3 volts) plus the resistive voltage drop in the portion of the N region located between two rows. As will be seen hereafter, this N-type region can have a reduced resistance and thus, normally, the bipolar diode corresponding to the bottom of each of trenches 3 has no influence.

When reverse biased, it can be shown that, calling S1 and S2 the respective surface areas in top view of a trench 3 and of an N-type region 2 located between two trenches, and calling D1 and D2 the corresponding dopings, in the case where S1*D1=S2*D2, the entire structure behaves as a quasi-intrinsic layer. Thus, the breakdown voltage will be strongly increased with respect to the breakdown voltage of a doped region, even lightly doped. Indeed, as seen previously, the less a layer is doped, the more it can withstand high voltages. In practice, it may be attempted to have S1=S2 and D1=D2. Then, doping level D2 of the N regions can be much higher than previously for a same breakdown voltage. For example, if for a conventional diode, a doping level on the order of $10^{15}$ atoms/cm$^3$ was desired, doping levels on the order of some $10^{16}$ atoms/cm$^3$ may now be obtained provided that they are balanced between the P and N regions.

Thus, the diode according to the present invention can both have a high reverse breakdown voltage and a low forward voltage drop.

As a result, it is particularly important to properly choose the doping levels of N and P regions 2 and 5 (so that, as indicated previously, S1*D1=S2*D2 or else S1=S2, so that D1=D2). This result can be simply achieved according to the present invention by the provision of silicon oxide layer 4 coating the lateral walls of the trenches. Indeed, after forming the N and P regions, a test may be performed to check whether the searched result is achieved. Otherwise, provided that the precaution of making sure that the doping level of the P region is greater than or equal to the searched level has been taken, an anneal for adjusting the structure may be performed. During the prior formation of insulating layer 4, N-type dopants (phosphorus atoms) of region 2 are "trapped" in layer 4, in the vicinity of the interface between region 2 and layer 4. During the anneal, the excess P-type dopants (boron atoms) in the polysilicon contained in trenches 3 are absorbed by layer 4 that simultaneously desorbs into region 2 the the previously trapped N-type dopants (phosphorus atoms). The dopings of trenches 3 and of region 2 then respectively tend to decrease and increase. It is thus possible to determine the initial doping levels and the anneal conditions to reach at the end therof the previously described equilibrium D1*S1=D2*S2.

As an example, in the absence of trenches filled with P-type polysilicon, the doping of the diode cathode would range between $1.10^{15}$ and $2.10^{15}$ corresponding to a resistance ranging between 0.3 and 0.5 Ω·mm$^2$ for a breakdown voltage of approximately 150 to 200 volts. In the presence of the trenches filled with polysilicon according to the present invention, the doping of epitaxial layer 2 would be on the order of some $10^{16}$ atoms/cm$^3$ corresponding to a resistance ranging between 0.08 and 0.12 Ω·mm$^2$ for a breakdown voltage of approximately 150 to 200 volts.

Given that a Schottky diode according to the present invention has an on-state resistance much smaller than that of a conventional Schottky diode, it will have a much smaller surface area despite the surface area doubling due to the existence of the trenches.

The principles of the present invention also apply to the manufacturing in vertical form of other unipolar components, for example, a vertical MOS transistor including a plurality of source cells.

Figure 5:
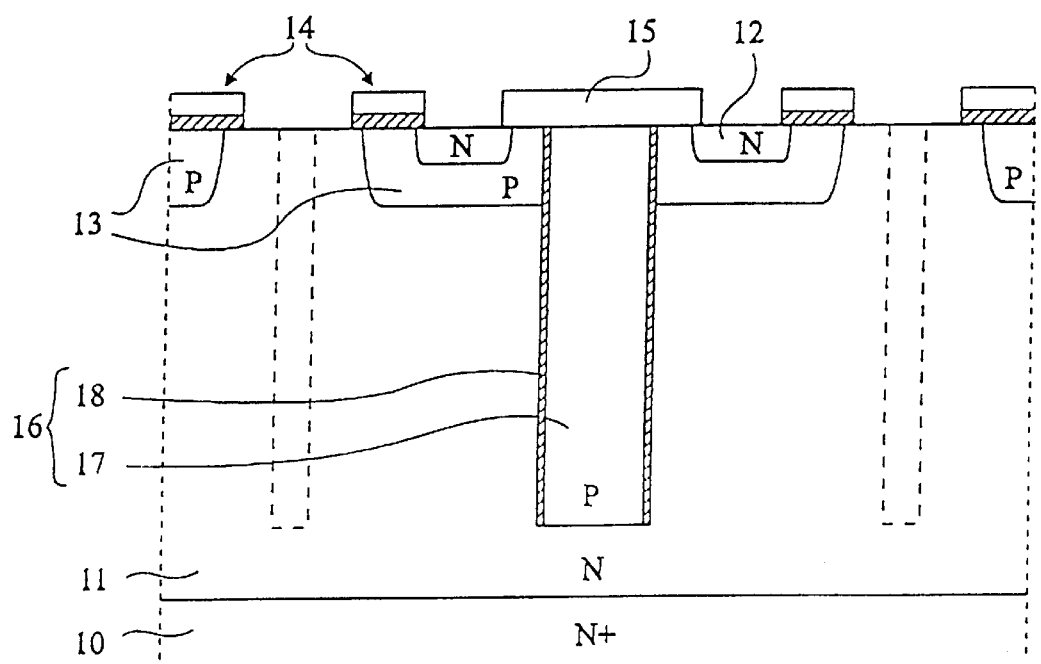
FIG. 5 is a partial simplified cross-section view of a MOS transistor obtained by means of an example of implementation of a manufacturing method according to the present invention.

As illustrated in FIG. 5, a source cell of a vertical MOS transistor is formed in a layer 11 that covers a single-crystal silicon substrate 10. Layer 11 is of the same conductivity type as substrate 10, for example, type P, and is less heavily doped. The cells are formed of an N-type doped source region 12 formed in a P-type well 13, of an insulated gate structure 14 and of a source metallization 15.

Layer 11 includes, according to the present invention, trenches 16 filled with P-type polysilicon 17, the walls of which are coated with a thin silicon oxide layer 18. Trenches 16 filled with polysilicon 17, after an anneal according to the present invention, have an apparent doping close to that of layer 11.

In the embodiment shown in FIG. 5, trenches 16 are formed substantially at the center of the source cells, under source metallization 15. It should be noted that the trenches can then be contacted by metallizations electrically connected to source metallizations 15 of the transistor.

According to another embodiment, trenches 16 are formed between two source cells, for example at the locations indicated in dotted lines in FIG. 5.

According to another embodiment, the two previous embodiments are combined to improve the breakdown voltage. In other words, a transistor then includes trenches at the center of the source cells and peripheral trenches, each formed between two such cells. As in the preceding embodiment, the peripheral trenches may then be contacted by metallizations electrically connected to source metallizations 15.

Similarly to what has been previously discussed in the case of a Schottky diode, the present invention enables obtaining transistors having a smaller on-state resistance and a greater off-state breakdown voltage withstand.

Indeed, the doping of layer 11 may be chosen to be greater than that of the homologous layer of conventional structures, whereby its on-state resistance decreases. This is possible due to the balancing of the doping of the trenches filled with polysilicon and of layer 11 that ensures that, in reverse, the breakdown voltage is high.

Of course, the present invention is likely to have various alterations, modifications, and improvements which will readily occur to those skilled in the art. In particular, the present invention applies to the forming in vertical monolithic form of any type of unipolar component, be it to reduce its on-state resistance for a given breakdown voltage, or to improve its breakdown voltage without increasing its on-state resistance.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A unipolar component of vertical type including, in a layer of a first conductivity type, trenches filled with polysilicon of the second conductivity type, the lateral walls of the trenches being coated with a silicon oxide layer and the polysilicon being in contact with the layer of the first conductivity type at the bottom of the trench, the polysilicon doping being adjusted to be equal to that of the layer of first conductivity type.

2. The component of claim 1, forming a Schouky diode, wherein the trenches are formed in a layer intended for forming the diode cathode.

3. The component of claim 1, forming a MOS transistor, including a plurality of source cells and wherein the trenches are formed at the center of each of the cells.

4. The component of claim 1, forming a MOS transistor including a plurality of source cells and wherein the trenches are formed between the cells.

5. The component of claim 1, forming a MOS transistor including a plurality of source cells and wherein the trenches are formed at the center of the cells and between the cells.

6. The component of claim 4, wherein the surfaces of the trenches between cells are in contact with metallizations electrically connected to source metallizations of the cells.

7. The component of claim 5, wherein the surfaces of the trenches between cells are in contact with metallizations electrically connected to source metallizations of the cells.

8. A unipolar component of vertical type comprising: a semiconductor layer of a first conductivity type having trenches being filled with a semiconductor of the second conductivity type, the lateral walls of the trenches being coated with an insulator layer and the semiconductor of the second conductivity type being in contact with the layer of the first conductivity type at the bottom of the trench, the doping of the semiconductor of the second conductivity type being adjusted to be equal to that of the layer of first conductivity type.

* * * * *

UNITED STATES PATENT AND TRADEMARK OFFICE
CERTIFICATE OF CORRECTION

PATENT NO.    : 6,590,240 B1
DATED         : July 8, 2003
INVENTOR(S)   : Frédéric Lanois Page 1 of 1

It is certified that error appears in the above-identified patent and that said Letters Patent is hereby corrected as shown below:

<u>Column 5,</u>
Line 25, should read:

-- 2. The component of claim 1, forming a Schottky diode, --

Signed and Sealed this

Seventh Day of October, 2003

JAMES E. ROGAN
*Director of the United States Patent and Trademark Office*